United States Patent [19]

Takahashi

[11] Patent Number: 4,604,776
[45] Date of Patent: Aug. 12, 1986

[54] SPACER FOR MOUNTING BOARDS

[75] Inventor: Katsumasa Takahashi, Nagoya, Japan

[73] Assignee: Kitagawa Industries Co., Ltd., Nagoya, Japan

[21] Appl. No.: 594,732

[22] Filed: Mar. 29, 1984

[30] Foreign Application Priority Data

Apr. 20, 1983 [JP] Japan .............................. 58-58941[U]

[51] Int. Cl.⁴ ........................ F16B 19/00; H05K 7/12
[52] U.S. Cl. ....................................... 24/453; 24/297; 174/138 D
[58] Field of Search ............. 174/138 D; 24/453, 573, 24/297, 458, 305, 628, 326, 336; 248/467, 205.5, 206.2, 206.3; 411/500, 508, 907, 908, 358; 361/418, 419, 420

[56] References Cited

U.S. PATENT DOCUMENTS

| | | | |
|---|---|---|---|
| 1,645,229 | 10/1927 | Churmusi | 248/206.3 X |
| 3,811,154 | 5/1974 | Lindeman et al. | 174/138 D X |
| 3,893,208 | 7/1975 | Yuda | 411/508 X |
| 4,495,380 | 1/1985 | Ryan et al. | 24/453 X |

FOREIGN PATENT DOCUMENTS

| | | | |
|---|---|---|---|
| 2457228 | 6/1976 | Fed. Rep. of Germany | 174/138 D |
| 1271400 | 4/1972 | United Kingdom | 174/138 D |
| 2125100 | 2/1984 | United Kingdom | 174/138 D |
| 2125878 | 3/1984 | United Kingdom | 174/138 D |

Primary Examiner—Laramie E. Askin
Attorney, Agent, or Firm—Oblon, Fisher, Spivak, McClelland & Maier

[57] ABSTRACT

A spacer for mounting boards, such as wiring boards or printed circuit boards, made of synthetic resin and comprising a resilient detent member provided at one end of a center support pillar member which extends in the vertical direction from the center of the resilient detent member, a pair of resilient reverse detent leg members provided at both sides of the support pillar member and extending obliquely downward so as to prevent the spacer from coming off out of the board or boards when inserted through a hole formed in one of the boards and mounted on the boards by restoring its inherently extended condition of the leg members, and a resilient support member provided at the other end of the support pillar member, all which components are integrally formed in one piece. With this construction, the spacer can be easily mounted at one of the boards so as to hold the boards and maintain a space between the boards without bending, even if it is mounted on the wiring boards carrying heavy electronic parts thereon. The spacer is simple in construction and is easy for manufacturing at low cost.

22 Claims, 12 Drawing Figures

SPACER FOR MOUNTING BOARDS

BACKGROUND OF THE INVENTION

1. Field of the Invention

The present invention relates to a spacer made of synthetic resin and for maintaining space between base plates or boards such as wiring boards or printed circuit boards by inserting into a mounting hole formed on one of the boards and fixing said boards when using a plurality of the boards in a stacked condition.

2. Description of the Prior Art

When mounting many wiring boards, for instance, on a chassis of an electronic apparatus or appliance according to the prior art, it is often desired that each board is stacked in the horizontal direction at a predetermined distance, with one edge of each board coupled on a frame through hinge means.

In this case, however, when rather heavy electronic parts are mounted on a wiring board such as is mentioned above, the board often becomes flexed downward, thus causing short circuited conditions to occur on the board or damages to the board to occur.

In order to prevent these short circuited conditions and damages to the board or boards from occurring, conventionally spacers are inserted between wiring boards. However, the spacers of this kind according to the prior art are used in such a manner that they are only sandwiched between the upper and lower boards, thus resulting in shortcomings such as that the spacers often come off by vibrations caused for some reasons or by accidental shocks when carrying out, for instance, maintenance work.

SUMMARY OF THE INVENTION

It is therefore an object of the present invention to provide a spacer for mounting boards, which is capable of easily inserting into a mounting hole formed on one of the boards and which is capable of holding, with resiliency, two boards such as upper and lower boards at a predetermined distance.

It is another object of the present invention to provide a spacer with a simple construction and capable of manufacturing at a low cost.

One of the features according to the present invention resides in a spacer made of synthetic resin and which can be mounted between boards such as wiring boards through a mounting hole formed in the board or boards by the insertion of part of the spacer wherein it comprises a dish-shaped resilient detent member provided at one end of a support pillar member, said support pillar member extending in the vertical direction from the center of the dish-shaped resilient detent member, a pair of resilient reverse detent leg members provided at both sides of the support pillar member and extending obliquely downward so as to prevent the spacer from coming off out of the board or boards when inserted through a hole and mounted on the boards by restoring its inherently extended condition of the resilient leg members, and a dish-shaped support member provided at the other end of said support pillar member, all the constructing components described above being integrally formed in one piece.

These and other objects, features, and advantages of the present invention will be apparent from the following detailed description with reference to the attached drawings.

DESCRIPTION OF THE PREFERRED EMBODIMENT

Figure 1:
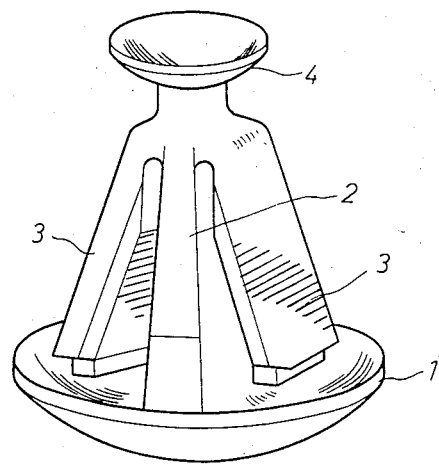
FIG. 1 illustrates an overall perspective view of the spacer according to the present invention.

The reader's attention is first referred to FIG. 1, where an overall perspective view of the spacer according to the present invention is shown. The spacer according to the present invention comprises a first dish-shaped resilient detent member 1, a support pillar member 2 extending in the vertical direction from the center of the first dish-shaped resilient detent member, a pair of resilient reverse detent leg members 3, 3, and a second dish-shaped resilient support member 4 for supporting one of the wiring boards, the top or upper portion of the second dish-shaped resilient support member 4 having a concave shape or a "cupule" shape. The second dish-shaped resilient support member 4 is smaller in diameter than the first dish-shaped resilient support member 1. All the components described above of the spacer according to the present invention are integrally formed in one piece made, for instance, of synthetic resin.

Figure 2:
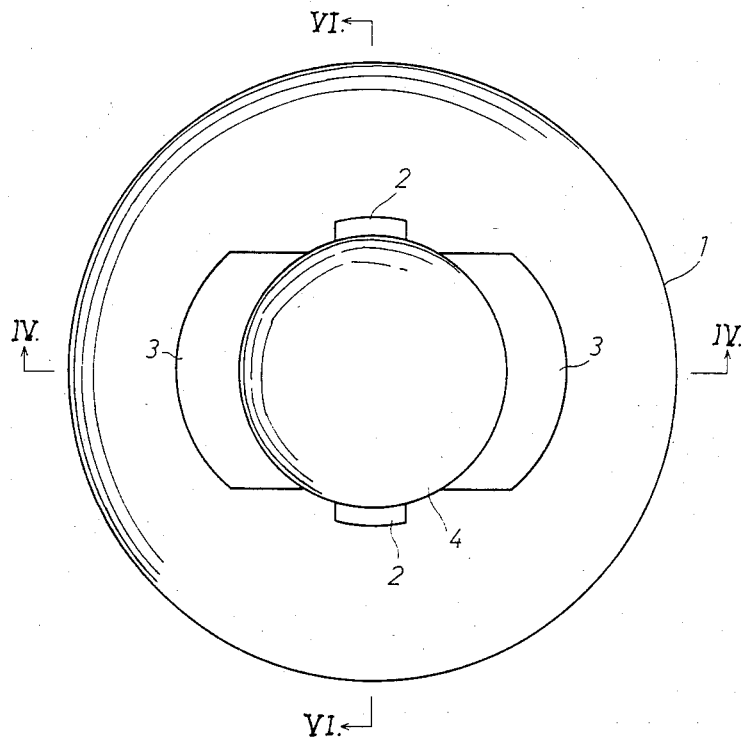
FIG. 2 illustrates a top view of the spacer according to the present invention shown in FIG. 1.
Figure 3:
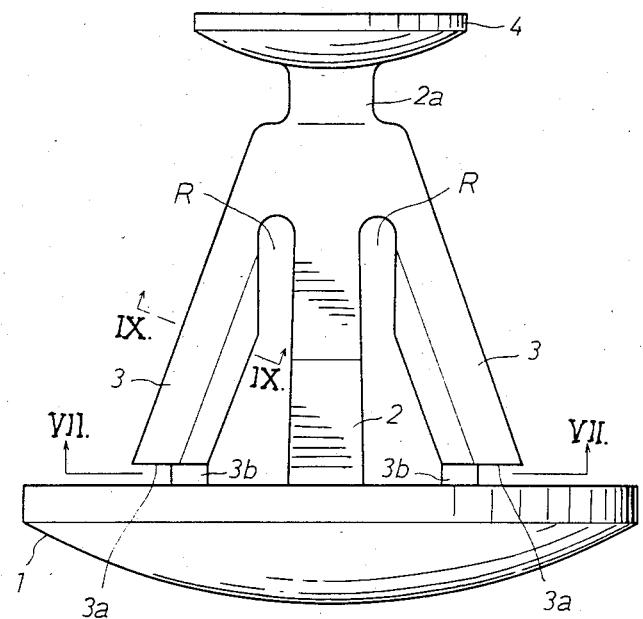
FIG. 3 illustrates an elevational view of the spacer according to the present invention shown in FIG. 1.

FIGS. 2 and 3 show, respectively, an enlarged top view and an elevational view of the spacer of the present invention shown in FIG. 1. The spacer for mounting boards according to the present invention is made of synthetic resin, for instance, 66 nylon, and it is integrally formed in one piece as more clearly shown in FIG. 4, so as to have resiliency.

Figure 4:
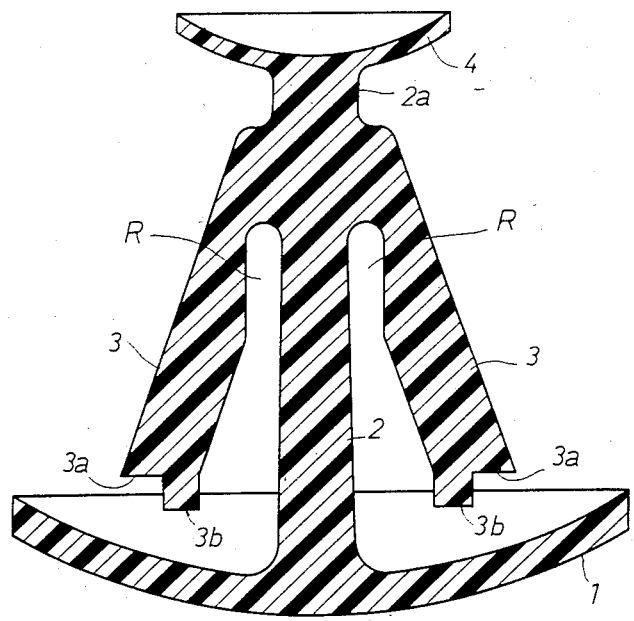
FIG. 4 illustrates an elevational cross sectional view of the spacer according to the present invention cut along the line IV—IV in FIG. 2.
Figure 9:
FIG. 9 illustrates a cross sectional view of the resilient reverse detent leg member cut along the line IX—IX in FIG. 3.

As shown in FIG. 4, the support pillar member 2 has a generally rectangular cross section and is formed on the center of the first dish-shaped resilient detent member 1 on its upper side and extends in the vertical direction therefrom. The resilient reverse detent leg members 3, 3 extend obliquely downwardly from the upper end of the support pillar member 2 so as to increase the distance between the leg members 3, 3 toward the downward direction. Each cross section of the leg members has an arc shape on the outer side as shown in FIG. 9. The leg members 3, 3 have a sufficient resiliency against the support pillar member 2 so as to be resiliently flexible at the lower end thereof in either opening or closing direction.

At the bottom surface of each resilient reverse detent leg member 3, there are provided respectively a horizontal notch portion 3a and a projection or an engagement member 3b which in combination form a stepped portion and which support one of the boards from the inner side of the one wiring board to be fixed, so as to engage with the inner side of a hole formed on the board. As shown in FIG. 4, the extreme end of each stepped portion of the engagement member 3b slightly enters into the recess of the dish-shaped resilient detent member 1. Moreover, the horizontal notch portion 3a of each resilient reverse detent leg member 3 securely contacts with the surface of the board to be mounted when mounting the spacer around the mounting hole. In the spacer according to the present invention, a bay-shaped spaced portion R (shown in FIG. 4) is formed at the root of the each resilient reverse detent leg member 3 so as to easily cause the leg member to be resiliently deformed in the right and left direction in the drawing.

Figure 5:
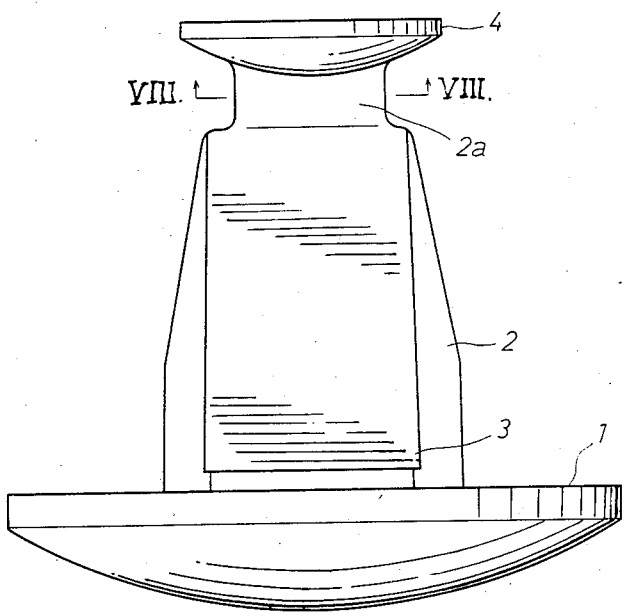
FIG. 5 illustrates a side view of the spacer according to the present invention shown in FIG. 1.
Figure 6:
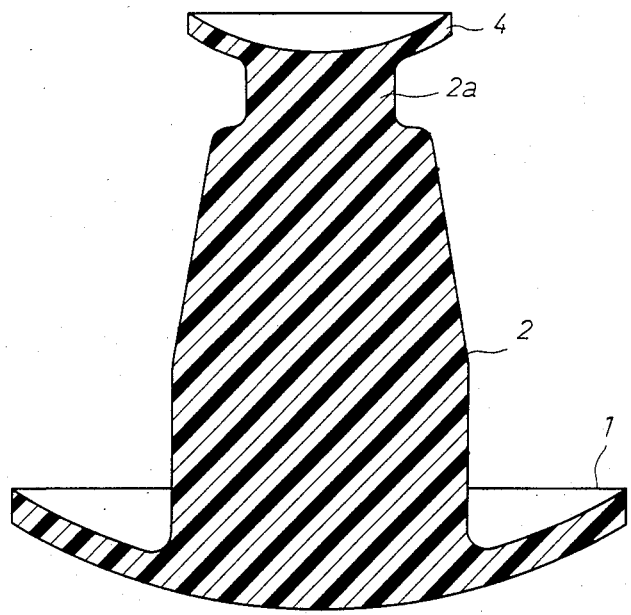
FIG. 6 illustrates a cross sectional view of the spacer cut along the line VI—VI in FIG. 2.
Figure 8:
FIG. 8 illustrates a cross sectional view of the neck portion of the support pillar member cut along the line VIII—VIII in FIG. 5.

FIG. 5 shows a side view of the spacer having the resilient reverse detent leg member 3. The width of the leg member 3 is smaller than that of the central support pillar member 2 having the neck portion 2a. FIG. 8 shows the cross-section of the neck portion 2a of the support pillar member 2. It is to be understood that it has generally an elliptical cross section.

Turning back to FIG. 4, at the top of the support pillar member 2 having the neck portion 2a, there is horizontally formed the second dish-shaped resilient support member 4 having the hollow cupule directed upwardly, so as to resiliently support one wiring board.

Figure 7:
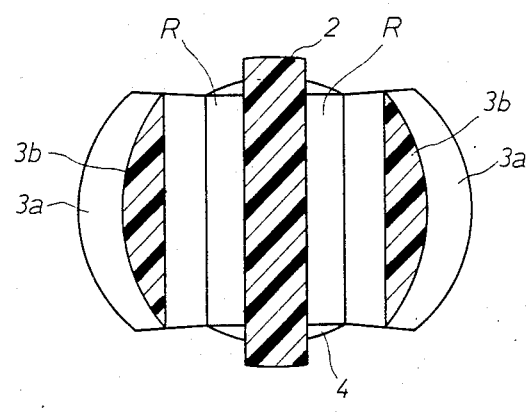
FIG. 7 illustrates a cross sectional view of the spacer cut along the line VII—VII in FIG. 3.

FIG. 7 shows a cross sectional view of the spacer cut along the line VII—VII in FIG. 3 and viewed toward the upper portion of the spacer so as to indicate each positional relationship. The spacers for mounting boards according to the present invention thus constructed are used, for instance, for mounting wiring boards on a chassis of an electronic apparatus, secured or fixed by a plurality of mounting supports and bolts and nuts, stacking the boards at a predetermined distance.

Figure 10:
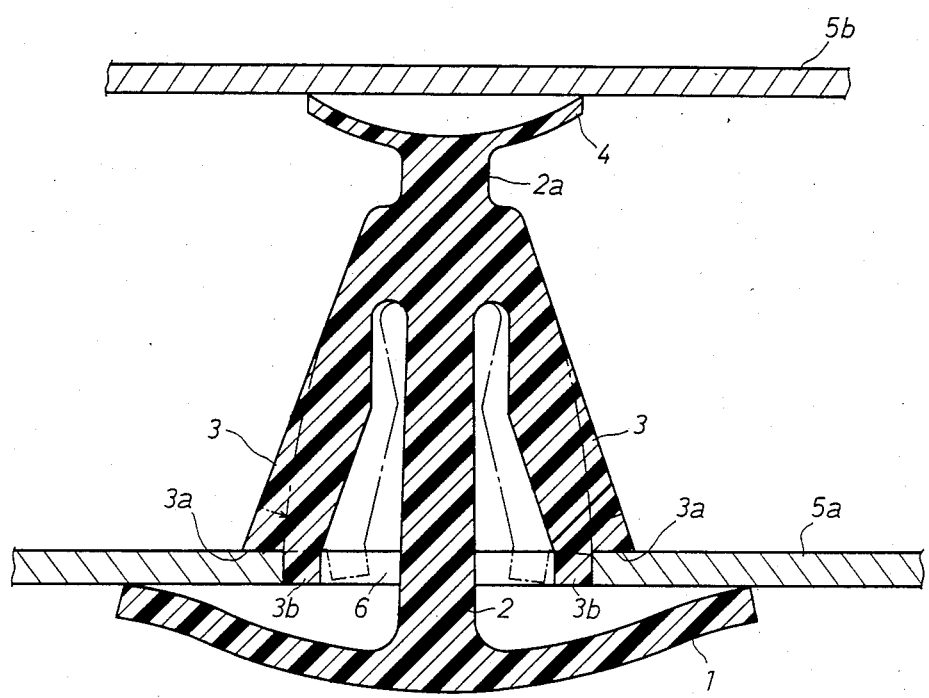
FIG. 10 illustrates a cross sectional view of the spacer according to the present invention mounted on one wiring board through a hole formed thereon, with the other wiring board being supported by the top portion of the spacer.

FIG. 10 shows a cross sectional view of the spacer according to the present invention mounted between the two wiring boards, 5a, 5b, through a mounting hole 6 formed in one of the boards, i.e., the lower board 5a in this case, with the second dish-shaped resilient support member 4 supporting the other board 5b.

When mounting the spacer to the boards, the second dish-shaped resilient support member 4 is firstly pushed into the hole 6 formed on the lower board 5a, with both resilient reverse detent leg members 3, 3 being deformed as indicated by the dot-dashed line or a chain line, until the edge of the resilient detent member 1 contacts with the outer surface of the board 5a. In this case, the diameter of the mounting hole 6 is formed in such a manner that when both horizontal notch portions 3a of the spacer have penetrated through the hole 6 and the pair of the resilient reverse detent leg members 3, 3 have returned to their normal positions after passing through the hole 6, the stepped portions consisting of the horizontal notch portions 3a and the engagement members 3b come to engage with the edge of the hole 6. Thus, the stepped portions tightly hold the inner wall of the hole 6 and the periphery of the inner surface of the board 5a around the hole.

Accordingly, a further pushing operation of the resilient detent member 1 (i.e., of the bottom thereof by hand) enables the resilient detent member 1 to be deformed flatly, so that the whole portion of the spacer except for the first dish-shaped resilient detent member 1 can completely penetrate through the hole 6, and each horizontal notch portion 3a of the leg members 3 projects from the hole 6 and engages with the inner surface of the board 5a around the hole. As a result, the engagement member 3b and the horizontal notch portion 3a grasp the inner wall of the hole 6 and the inner surface of the board 5a, around the hole 6 after the resiliency of the leg members 3, 3 has restored nearly their original shape.

In this manner as described, the spacer according to the present invention can be securely fixed on boards such as wiring boards, and it can securely maintain the space between the two boards by the first dish-shaped resiliency of the resilient detent member 1 and the resilient reverse detent leg members 3, 3 through the hole 6 formed on one board 5a without losing its resiliency and backlash.

Moreover in the spacer according to the present invention, since the second dish-shaped resilient support member 4 can be also deformed on the inner surface of the other board 5b when pushed into the hole and contacted with the inner surface thereof, the spacer can favorably support the boards and secure a space between the boards with its resiliency.

Figure 11:
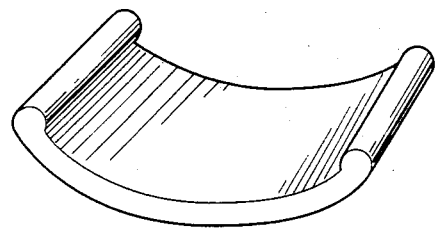
FIG. 11 illustrates a perspective view showing another embodiment of the dish-shaped resilient support member 4 according to the present invention, and FIG. 12 also illustrates a perspective view showing another embodiment of the dish-shaped resilient support member 4 according to the present invention.
Figure 12:
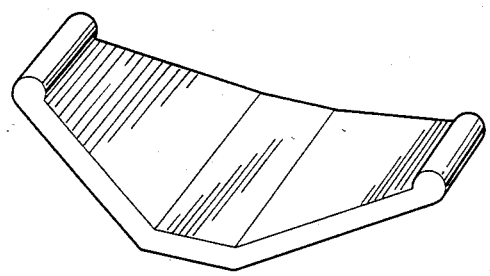

In the foregoing embodiment, the second dish-shape resilient support member 4 can have a variety of shapes. Accordingly, the dish-shaped resilient support member 4 is not limited to a circular shape only. It can be formed like the embodiments shown in FIGS. 11 and 12. Specifically, FIG. 11 shows a second resilient support member in the shape of a segment of a cylindrical pipe, and FIG. 12 shows a second resilient support member formed from a plurality of planar segments angled relative to one another. The first resilient detent member 1 is also not limited to the form as described. For instance, it can have a rectangular flat form.

As described in the foregoing, the spacer for mounting boards according to the present invention is characterized in that it comprises a dish-shaped resilient detent member provided at one end of a support pillar member, said support pillar member extending in the vertical direction from the center of the dish-shaped resilient detent member, a pair of resilient reverse detent leg members provided at both sides of the support pillar member and extending obliquely downwardly so as to prevent the spacer from coming off out of the board or boards when inserted through a hole and mounted on the boards by restoring its inherently extended condition of the resilient leg members, and a dish-shaped resilient support member provided at the other end of said support pillar member. All of the constructing elements or components are integrally formed in one piece.

Accordingly, the spacer according to the present invention can be easily inserted into a mounting hole formed on a board, it can resiliently hold the boards and maintain a space between the boards without bending even if it is mounted on the wiring boards carrying heavy electronic elements for an electronic apparatus or appliance.

Moreover, since the spacer according to the present invention is made of synthetic resin and is integrally formed in one piece, it has a high rigidity with a simple construction, as well as being easy for manufacturing at low cost.

While the invention has been described in its preferred embodiment, it is to be understood that the words which have been used are words of description rather than limitation and that various changes and modifications can be made within the purview of the appended claims without departing from the true scope and spirit of the invention in its broader aspects.

What is claimed is:

1. A spacer for mounting a first board having a hole therethrough and a second board spaced from the first board, each of the boards having a first surface and a second surface, said spacer comprising:
    (a) a first resilient detent member having a first side and a second side, the second side being concave and, in use, resiliently engaging the first surface of the first board around the hole in the first board;
    (b) a support pillar member having a first end and a second end, the first end of said support pillar member extending from a central portion of the second side of said first resilient detent member and, in use, extending through the hole in the first board;
    (c) at least two resilient reverse detent leg members each of which has a first end and a second end, the second ends of said at least two resilient reverse detent leg members extending symmetrically from the second end of said support pillar member, said at least two resilient reverse detent leg members being sized, shaped, and positioned so that, in use, the first ends of said at least two resilient reverse detent leg members are cammed inwardly by passage through the hole in the first board, after which the first ends of said at least two resilient reverse detent leg members are held resiliently against the second surface of the first board by the resiliency of said first resilient detent member; and
    (d) a second resilient detent member having a first side and a second side, the first side of said second resilient detent member being joined to the second end of said support pillar member and the second side being concave and, in use, resiliently engaging the first surface of the second board, said second resilient detent member being sized and shaped so that, in use, said second resilient detent member will pass through the hole in the first board,
    (e) said first resilient detent member, said support pillar member, said at least two resilient reverse detent leg members, and said second resilient detent member all being formed integrally as one piece.

2. A spacer as recited in claim 1 wherein said first resilient detent member is dish-shaped.

3. A spacer as recited in claim 1 wherein said support pillar member is generally rectangular in cross-section perpendicular to said first resilient detent member.

4. A spacer as recited in claim 1 and comprising two and only two oppositely directed resilient reverse detent leg members.

5. A spacer as recited in claim 1 wherein the first end of each of said at least two resilient reverse detent leg members contains a notch defined by two surfaces sized, shaped, and positioned so that, in use, one of said two surfaces makes surface contact with the second surface of the first board and the other of said two surfaces makes surface contact with the periphery of the hole through the first board.

6. A spacer as recited in claim 1 wherein said second resilient detent member is dish-shaped.

7. A spacer as recited in claim 1 wherein said second resilient detent member is in the shape of a segment of a cylindrical pipe.

8. A spacer as recited in claim 1 wherein said second resilient detent member is formed from a plurality of planar segments angled relative to one another.

9. A spacer as recited in claim 9 wherein the spacer is formed from a synthetic resin.

10. A spacer as recited in claim 9 wherein the surfaces of said at least two resilient reverse detent leg members remote from said support pillar member are arc-shaped and are shaped so that, in use, they make linear camming contact with a corresponding arc shape of the entry of the hole in the first board as said at least two resilient reverse detent leg members pass through the hole in the first board.

11. A spacer as recited in claim 9, wherein a bay-shaped clearance space is formed between said support pillar member and each of said at least two resilient reverse detent leg members where the latter join the former, thereby facilitating resilient inward deformation of the latter as the latter pass through the hole in the first board.

12. A spacer for mounting a first board having a hole therethrough and a second board spaced from the first board, each of the boards having a first surface and a second surface, said spacer comprising:
    (a) a first resilient detent member having a first side and a second side, the second side, in use, resiliently engaging the first surface of the first board around the hole in the first board;
    (b) a support pillar member having a first end and a second end, the first end of said support pillar member extending from a central portion of the second side of said first resilient detent member and, in use, extending through the hole in the first board;
    (c) at least two resilient reverse detent leg members each of which has a first end and a second end, the second ends of said at least two resilient reverse detent leg members extending symmetrically from the second end of said support pillar member, said at least two resilient reverse detent leg members being sized, shaped, and positioned so that, in use, the first ends of said at least two resilient reverse detent leg members are cammed inwardly by passage through the hole in the first board, after which the first ends of said at least two resilient reverse detent leg members are held resiliently against the second surface of the first board by the resiliency of said first resilient detent member; and
    (d) a second resilient detent member having a first side and a second side, the first side of said second resilient detent member being joined to the second end of said support pillar member and the second side, in use, resiliently engaging the first surface of the second board, said second resilient detent member being sized and shaped so that, in use, said second resilient detent member will pass through the hole in the first board, (e) said first resilient detent member, said support pillar member, said at least two resilient reverse detent leg members, and said second resilient detent member all being formed integrally as one piece, and (f) the portion of said support pillar member adjacent said second resilient detent member having a generally elliptical cross-section parallel to said second resilient detent member.

13. A spacer as recited in claim 12 wherein said first resilient detent member is dish-shaped.

14. A spacer as recited in claim 12 wherein said support pillar member is generally rectangular in cross-section perpendicular to said first resilient detent member.

15. A spacer as recited in claim 12 and comprising two and only two oppositely directed resilient reverse detent leg members.

16. A spacer as recited in claim 12 wherein the first end of each of said at least two resilient reverse detent leg members contains a notch defined by two surfaces sized, shaped, and positioned so that, in use, one of said two surfaces makes surface contact with the second surface of the first board and the other of said two surfaces makes surface contact with the periphery of the hole through the first board.

17. A spacer as recited in claim 12 wherein said second resilient detent member is dish-shaped.

18. A spacer as recited in claim 12 wherein said second resilient detent member is in the shape of a segment of a cylindrical pipe.

19. A spacer as recited in claim 12 wherein said second resilient detent member is formed from a plurality of planar segments angled relative to one another.

20. A spacer as recited in claim 12 wherein the spacer is formed from a synthetic resin.

21. A spacer as recited in claim 12 wherein the surfaces of said at least two resilient reverse detent leg members remote from said support pillar member are arc-shaped and are shaped so that, in use, they make linear camming contact with a corresponding arc shape of the entry of the hole in the first board as said at least two resilient reverse detent leg members pass through the hole in the first board.

22. A spacer as recited in claim 12 wherein a bay-shaped clearance space is formed between said support pillar member and each of said at least two resilient reverse detent leg members where the latter join the former, thereby facilitating resilient inward deformation of the latter as the latter pass through the hole in the first board.

* * * * *